United States Patent
Kang et al.

(10) Patent No.: US 9,111,614 B2
(45) Date of Patent: Aug. 18, 2015

(54) RESISTIVE SWITCHING MEMORY DEVICE AND METHOD FOR OPERATING THE SAME

(71) Applicant: PEKING UNIVERSITY, Beijing (CN)

(72) Inventors: Jinfeng Kang, Beijing (CN); Bing Chen, Beijing (CN); Bin Gao, Beijing (CN); Feifei Zhang, Beijing (CN); Lifeng Liu, Beijing (CN); Xiaoyan Liu, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 14/367,195

(22) PCT Filed: Dec. 21, 2012

(86) PCT No.: PCT/CN2012/087090
§ 371 (c)(1),
(2) Date: Jun. 19, 2014

(87) PCT Pub. No.: WO2013/091564
PCT Pub. Date: Jun. 27, 2013

(65) Prior Publication Data
US 2014/0347913 A1     Nov. 27, 2014

(30) Foreign Application Priority Data

Dec. 23, 2011   (CN) .......................... 2011 1 0439905

(51) Int. Cl.
*G11C 11/00*     (2006.01)
*G11C 13/00*     (2006.01)

(52) U.S. Cl.
CPC .......... *G11C 13/0069* (2013.01); *G11C 13/003* (2013.01); *G11C 13/0007* (2013.01);
(Continued)

(58) Field of Classification Search
CPC ........... G11C 13/0069; G11C 2213/79; G11C 13/0004; G11C 8/08; G11C 13/0028; G11C 8/10
USPC ................................ 365/148, 185.19, 185.23
See application file for complete search history.

(56) References Cited

U.S. PATENT DOCUMENTS

| 2003/0137877 A1 | 7/2003 | Mokhlesi et al. |
| 2005/0105210 A1 | 5/2005 | Okawa et al. |

(Continued)

FOREIGN PATENT DOCUMENTS

| CN | 1623203 A | 6/2005 |
| CN | 1623206 A | 6/2005 |

(Continued)

OTHER PUBLICATIONS

International Search Report dated Apr. 4, 2014 of International Patent Application No. PCT/CN2012/087090, 4 pages.

(Continued)

*Primary Examiner* — Tuan T Nguyen
(74) *Attorney, Agent, or Firm* — Kilpatrick Townsend & Stockton LLP

(57) ABSTRACT

A resistive switching memory device and a method for operating the same are disclosed. The device includes a plurality of resistive switching memory units arranged in a matrix, each of which includes a switching element and a resistive switching device, and the switching element being connected to a word line at its control terminal, to the resistive switching device at one terminal, and to a bit line at the other terminal; a word line decoder adapted to decode an input address signal to switch on the switching element in at least one of resistive switching memory units; and a driving circuit adapted to apply a voltage pulse whose front edge changes slowly across the resistive switching device by the bit line synchronously with the switching-on of the switching element. Using the scheme of the above embodiments, the durability characteristic of the resistive switching device can be improved, such as degradation of high-low resistance value window and the failure of the device with transition times can be reduced.

10 Claims, 4 Drawing Sheets

(52) U.S. Cl.
CPC ........ *G11C13/0097* (2013.01); *G11C 13/0028* (2013.01); *G11C 2013/0073* (2013.01); *G11C 2013/0092* (2013.01); *G11C 2213/74* (2013.01); *G11C 2213/79* (2013.01)

(56) References Cited

U.S. PATENT DOCUMENTS

| | | |
|---|---|---|
| 2010/0271861 A1 | 10/2010 | Kitagawa |
| 2012/0069622 A1* | 3/2012 | Parkinson et al. ............ 365/145 |
| 2012/0069633 A1 | 3/2012 | Katoh |
| 2013/0182524 A1* | 7/2013 | Jeon et al. ................ 365/233.11 |

FOREIGN PATENT DOCUMENTS

| | | |
|---|---|---|
| CN | 101872643 A | 10/2010 |
| CN | 102117811 A | 7/2011 |
| WO | 2011-121971 A1 | 10/2011 |

OTHER PUBLICATIONS

English Translation of Written Opinion dated Apr. 4, 2014 of International Patent Application No. PCT/CN2012/087090, 8 pages.

* cited by examiner

RESISTIVE SWITCHING MEMORY DEVICE AND METHOD FOR OPERATING THE SAME

CROSS-REFERENCES TO RELATED APPLICATIONS

This application is a National Stage of International Application No. PCT/CN2012/087090, filed Dec. 21, 2012, and which claims the benefit of Chinese Patent Application No. 201110439905.5, filed Dec. 23, 2011, the disclosure of which is hereby incorporated by reference in its entirety for all purposes.

TECHNICAL FIELD

An embodiment of the present disclosure relates to a semiconductor integrated circuit, and in particular, to a resistive switching memory device for storing information and a method for operating the same.

BACKGROUND

At present, a resistive random access memory (ReRAM) is a novel Non-volatile memory device which stores information by using a change in a resistance value, and has the advantages of high operation speed (<5 ns), low operation voltage (<1V), high storage density, and easy being integrated etc. Thus, the resistive switching memory is a prospective candidate for the next-generation semiconductor memory.

The storage unit of the resistive switching memory device typically has an metal-insulator-metal (MIM) configuration in which a medium thin film material having a variable-resistance characteristic is sandwiched between two metal electrodes. The variable-resistance material is typically a metal oxide, such as NiO, $TiO_2$, $HfO_2$, $ZrO_2$, $WO_3$, $Ta_2O_5$, or the like. The resistive switching memory devices can be classified as unipolar or bipolar devices according to its operation scheme. As for the former, a unipolar voltage is applied across a resistive switching memory device, and a resistance value of the variable-resistance material is transited between a high-resistance state and a low-resistance changes with different amplitudes of the externally applied voltage to write data into the resistive swithcing memory device or erase data therefrom. As for the latter, voltages having different polarities are applied across the resistive swithcing memory device to control the transition of the resistance value of the variable-resistance material. Typically, a change from the high-resistance state to the low-resistance state of the variable-resistance material is referred to as PROGRAM or SET operation, and a change from the low-resistance state to the high-resistance state of the variable-resistance material is referred to as ERASE or RESET operation.

Although the resistive switching memory have many advantages, the erasing times (transition times) of it is required to reach at a certain order of magnitude such as above $10^{12}$, in order to satisfy the requirements of the general memories. However, the erasing times (transition times) of the present resistive switching memory is under $10^9$.

SUMMARY OF THE DISCLOSURE

One object of the present disclosure is to provide a resistive switching memory device resistive switching memory device capable of improving the erasing-writing times and a method for operating the same.

According to embodiments of the present disclosure, there is provided a resistive switching memory device, comprising: a plurality of resistive switching memory units arranged in a matrix, each of resistive switching memory units including a switching element and a resistive switching device, and the switching element being connected to a word line at a control terminal, to the resistive device at one terminal, and to a bit line at the other terminal; a word line decoder adapted to decode an input address signal to switch on the switching element in at least one of resistive switching memory units; and a driving circuit adapted to apply a voltage pulse whose front edge changes slowly across the resistive switching device by the bit line synchronously with the switching-on of the switching element.

According to embodiments of the present disclosure, there is provided a method for operating a resistive switching memory device, the resistive switching memory device comprising a plurality of resistive switching memory units arranged in a matrix, each of resistive switching memory units including a switching element and a resistive switching device, and the switching element being connected to a word line at a control terminal, to the resistive switching device at one terminal, and to a bit line at the other terminal, the method comprises steps of: decoding an input address signal to switch on the switching element in at least one of resistive switching memory units; and applying a voltage pulse whose front edge changes slowly across the resistive switching device by the bit line synchronously with the switching on of the switching element.

By utilizing the schemes of the above embodiments, the durability characteristic of the resistive switching device can be improved, such as degradation of high-low resistance value window and the failure of the device with transition times can be reduced.

BRIEF DESCRIPTION OF THE DRAWINGS

The above and other objects, features, and advantages of the present disclosure will be more apparent from the following description of the embodiments of the present disclosure taken in conjunction with the accompanying drawings in which the same reference numerals refer to the units having the same structure, and in which.

DETAILED DESCRIPTION

Figure 1:
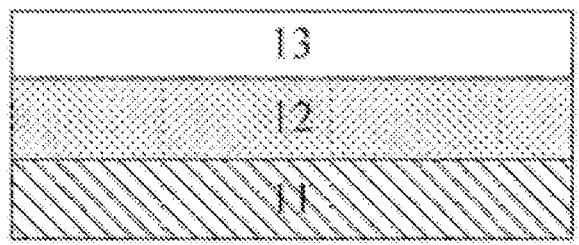
FIG. 1 schematically shows a structural schematic diagram of a resistive switching device according to an embodiment of the present disclosure.

Particular embodiments of the present disclosure will be described in more details below. It should be noted that the embodiments described here are used as merely exemplary, but not as limitation. In the following description, a number of specific details are explained in order to provide a comprehensive understanding of the present disclosure. However, it is obvious for those of ordinary skill in the art that the present disclosure cannot be implemented using these specific details necessarily. In other embodiments, descriptions of well-known circuits, materials, or methods are omitted for clarity and conciseness.

Throughout the specification, reference to "one embodiment," "a embodiment," "one example," or "an example" means: a specific feature, structure or characteristic described in conjunction with this embodiment of example is included in at least one embodiment of the invention. Thus, the phrase "in one embodiment," "in a embodiment," "one example," or "an example" appeared in the entire specification does not refer to the same embodiment or example. Furthermore, the specific feature, structure or characteristic may be combined in one or more embodiments or examples in any suitable combination and/or sub-combination. Moreover, those of ordinary skill in the art will recognize that the accompanying drawings are provided herein for the sake of explanation, and the accompanying drawings are not drawn to scale. It should be understood that a element may directly connected to or coupled to another element, or there is middle elements when it is "connected to" or "coupled to" another element. In contrast, there are not intervening elements present, when the element is "directly connected to" or "directly coupled to" another element. The same reference numerals refer to the same elements. A term "and/or" used herein comprises any or all combinations of one or more relatively listed items.

FIG. 1 schematically shows a structural schematic diagram of a resistive switching device according to an embodiment of the present disclosure.

As can be shown in FIG. 1, the resistive switching device according to an embodiment of the present disclosure includes a first electrode layer 13, a resistive materials layer 12, and a second electrode layer 11.

According to one embodiment of the present disclosure, the above bipolar resistive switching device may be manufactured by the following processes:

(1) a metal layer such as platinum (Pt) is deposited on a silicon substrate by physical vapor deposition (PVD) as the second electrode layer 11, the thickness of which is about 5-100 nm;

(2) one or more metal oxide layers are deposited by PVD or atomic layer deposition (ALD) as the resistive switching materials layer such as hafnium oxide ($HfO_2$), titanium oxide ($TiO_2$), the resistive materials layer with a thickness of about 5-30 nm;

(3) an impurity element such as gadolinium (Gd) is injected to the oxide by an ion implantation to increase defects to make the transition stable, and the impurity concentration being about 0.1-10% (atom number ratio occupied by gadolinium in a unit volume of the resistive switching layer);

(4) a metal layer or the other conductive material such as titanium nitride (TiN) is deposited by PVD as the first electrode layer 13;

(5) an isolated device is obtained by a method such as photolithography.

Figure 2:
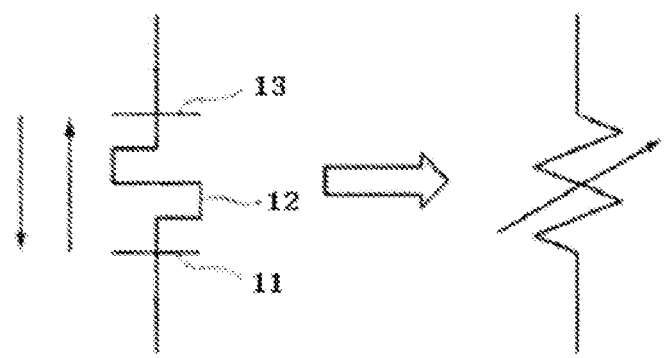
FIG. 2 shows a schematic diagram of the resistive switching device as shown in FIG. 1.

The resistive switching phenomenon of the metal oxide is caused by the switching on and switching off of a filament shaped conductive channel present inside the metal oxide. As shown in FIG. 2, under an exterior voltage, a new oxygen defect is generated inside the oxide, thereby resulting in a change from a high-resistance state to a low-resistance state of the device. When an opposite pulse voltage is applied, oxygen ions stored nearby an electrode interface are subject to an electrical field to be drifted to the neighborhood of the conductive channel, so as to cause oxygen vacancies exhausted by the electrical field to be recombined. A conductive channel of the oxygen vacancies formed at this point will break, thereby resulting in a change from the low-resistance state to the high-resistance state of the device.

The main reasons for durability degradation of the resistive switching device are as follows: 1) the electrode is oxidized to form a potential barrier which affects the charge transmission when the device operates in a high temperature for a long time, thereby causing a high-low resistance window to be small; 2) the breaking of the conductive channel of the oxygen vacancies requires to be recombined by oxygen ions, with the increase of the transition times, the oxygen ions stored at the electrode and the interface will be exhausted gradually, eventually to be insufficient of providing a number of oxygen ions required by the breaking of the conductive channel of the oxygen vacancies, thereby causing the high resistance state characteristic degradation; and 3) when a forward pulse is applied to the device to generate the oxygen vacancies so as to cause the device to be switched on, additional oxygen vacancies will be randomly generated around the channel, so that the channel becomes difficult to break when an opposite voltage is applied, thereby resulting in failure of the device.

The inventor of the present disclosure finds that the characteristic of the device are different when the device is operated by using a voltage having different pulse waveforms. An internal electric field of the device may be well controlled by replacing a square wave pulse with an adjusted pulse waveform (a triangular wave, a sinusoidal wave, a cosine wave, a raised cosine wave, or a trapezoidal wave) to operate the device. Since a pulse waveform whose front edge changes slowly proposed by the present disclosure may automatically increase the voltage in the resistive switching layer to generate sufficient oxygen ions to be recombined with the oxygen vacancies when the parasitical series resistances affects the degradation of the high-resistance state of the device, the durability characteristic of the device may be improved.

The method or the resistive switching memory device according to one embodiment of the present disclosure can improve the durability characteristic of the resistive switching device, such as reducing the degradation of high-low resistance value window and the failure of the device with transition times.

Figure 3:
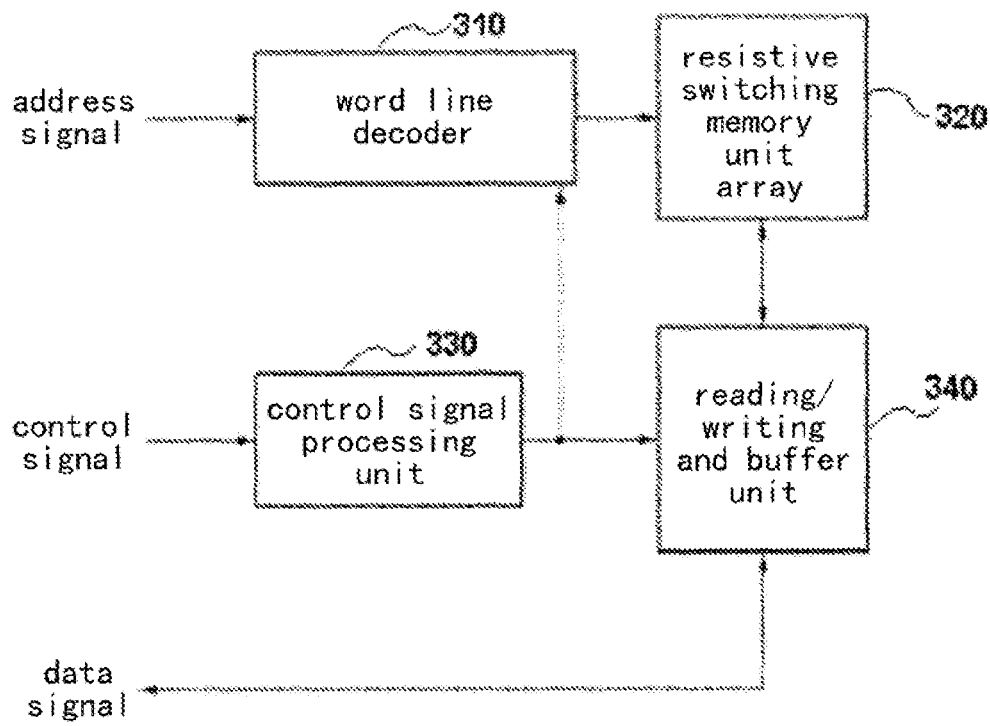
FIG. 3 shows a structural schematic block diagram of a resistive switching memory device according to an embodiment of the present disclosure.

FIG. 3 shows a structural schematic block diagram of a resistive switching memory device according to an embodiment of the present disclosure. The resistive switching memory device 300 according to the embodiment includes a word line decoder 310, a control signal processing unit 330, a resistive switching memory unit array 320, and a reading/writing and buffering unit 340.

The resistive switching memory unit array 320 includes a plurality of resistive switching memory units arranged in a matrix, each of which includes the above mentioned resistive switching device and a switching element. The switching element may be switched on when a selecting signal or an addressing signal is applied to the control terminal of the switching element. At the same time, a voltage pulse whose front edge changes slowly is applied across the resistive switching device to perform a programming operation or an erasing operation. According to one embodiment, the above mentioned voltage pulse, for example, is a triangular positive pulse whose peak value is 2.2V.

Figure 4:
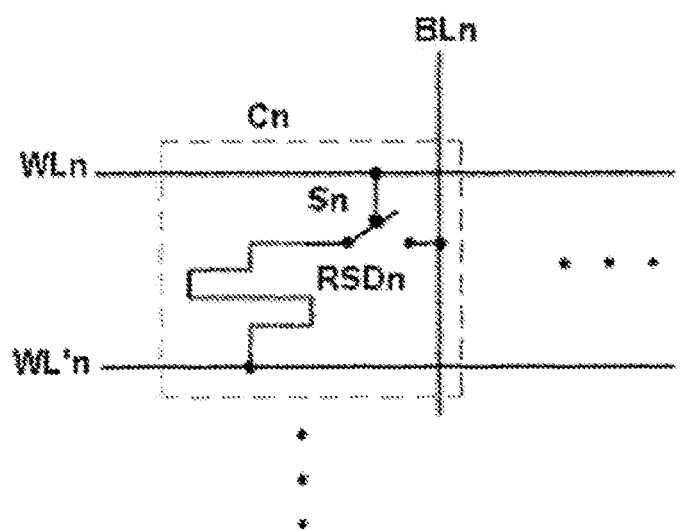
FIG. 4 schematically shows a structural diagram of a resistive switching memory unit in the resistive switching memory device according to an embodiment of the present disclosure.

FIG. 4 schematically shows a structural diagram of a resistive switching memory unit in the resistive switching memory device according to an embodiment of the present disclosure. As shown in FIG. 4, each of resistive switching memory units Cn includes a switching element Sn and a resistive switching device RSDn. The switching element Sn is connected to a word line WLn at a control terminal, connected to a bit line BLn at one terminal, and connected to a one terminal of the resistive switching device RSDn at other terminal. The other terminal of the resistive switching device RSD is connected to another conductive trail WL'n. In this way, a voltage pulse whose front edge changes slowly may be applied to the resistive switching device RSD by the bit line BLn and the other conductive rail WL'n to perform a programming operation or a erasing operation, when a signal of the bit line WLn is used to select Cn so that the switching element Sn is switched on.

Return to FIG. 3 again, the word line decoder 310 decodes an input address signal, thereby selecting a word line corresponding to the address signal, and outputs the decoded address signal to the resistive switching stroage array 320. The control signal processing unit 330 controls the bit line WLn and the conductive rail WL'n by the word line decoder 310 in response to a control signal.

Furthermore, the control signal processing unit 330 controls the reading/writing and buffering unit 340 to perform a reading and writing operation, a programming operation, or a erasing operation on the resistive switching storage array. For example, under the control of the control signal, a data signal is written into a resistive switching memory unit with a corresponding address, or stored information is read out from the resistive switching memory unit with the corresponding address. According to the embodiments of the present disclosure, during the programming operation or the erasing operation, the voltage pulse whose front edge changes slowly is applied across the resistive switching device of the resistive switching memory unit to improve the transition times of the resistive switching device, thereby improving the lifetime of the resistive switching memory device.

Figure 5:
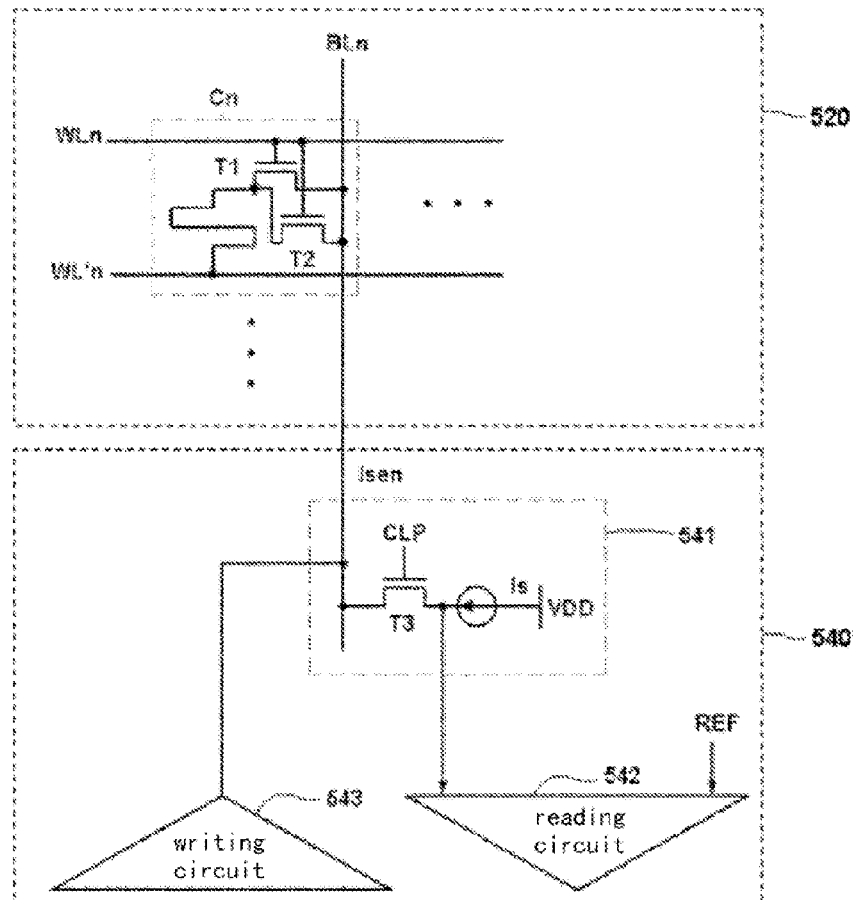
FIG. 5 shows a structural schematic diagram of a resistive switching memory device according to an embodiment of the present disclosure.

FIG. 5 shows a structural schematic diagram of a resistive switching memory device according to an embodiment of the present disclosure. As shown in FIG. 5, each of resistive switching memory units Cn in a resistive switching memory array 520 includes a resistive switching device and two NMOS transistors. The two NMOS transistors form the above mentioned switching element S1. A gate of one NMOS transistor T1 is connected to a word line WLn, a drain of T1 is connected to a bit line BLn, and a source of T1 is connected to one terminal of the resistive switching device. A gate of the other NMOS transistor T2 is connected to a word line WLn, a source of T2 is connected to the bit line BLn, and a drain of T2 is connected to one terminal of the resistive switching device. The other terminal of the resistive switching device is connected to a conductive rail WL'n.

A reading/writing and buffering unit 540 includes a writing circuit 543, a reading circuit 542, a control circuit 541, and a buffer (not shown). When the decoded signal output by the word line decoder 310 selects a corresponding resistive switching memory unit so that the switching element S1 is switched on, the writing circuit 543 applies a voltage pulse whose front edge changes slowly across the resistive switching device by the bit line BLn under the control of a control signal to perform a programming operation or an erasing operation.

According to a further embodiment of the present disclosure, the voltage pulse used by the writing circuit 543 is a positive pulse whose front edge rises up slowly. According to a yet embodiment of the present disclosure, the voltage pulse used by the writing circuit 543 is a negative pulse whose the front edge falls down slowly.

According to a further embodiment of the present disclosure, a period from a starting point to a pulse peak value or a pulse valley value of the voltage pulse is lager than 20% of duration of the voltage pulse.

According to a further embodiment of the present disclosure, the wave form of the voltage pulse is a triangular wave, a sinusoidal wave, a cosine wave, a raised cosine wave, or a trapezoidal wave.

In a further aspect, the reading circuit 542 reads related information from the resistive switching memory unit which have stored information under the control of the control signal. The control circuit 541 includes a switching element T3 and a current source Is. The switching element T3, for example. is an NMOS transistor, a drain of which is connected to one terminal of the current source Is and a source of which is connected to the bit line BLn. The switching element T3 receives a reading control signal at gate terminal of it. In the reading operation, the switching element T3 is switched on when the reading control signal is at a high level, thus a bias voltage is applied to the bit line BLn by the current source Is. In this way, when the reading circuit 542 is in a reading mode, the reading circuit 542 reads and amplifies a sensed current Isen flowing through the bit line BLn to obtain a sensed voltage signal, and compares the sensed voltage signal with a reference voltage REF to reading information stored in the resistive switching memory unit.

According to one embodiment of the present disclosure, a voltage pulse whose front edge changes slowly is used to operate the resistive switching memory device. For example, the resistive switching memory device includes a plurality of resistive switching memory units arranged in a matrix, each of which includes a switching element and a resistive switching device. The switching element is connected to a word line at its control terminal, to the resistive switching device at one terminal, and to a bit line at the other terminal. According to such a method, an input address signal is decoded to switch on the switching element in at least one of resistive switching memory units. Then a voltage pulse whose front edge changes slowly is applied across the resistive switching device by the bit line synchronously with the switching on of the switching element.

Figure 6:
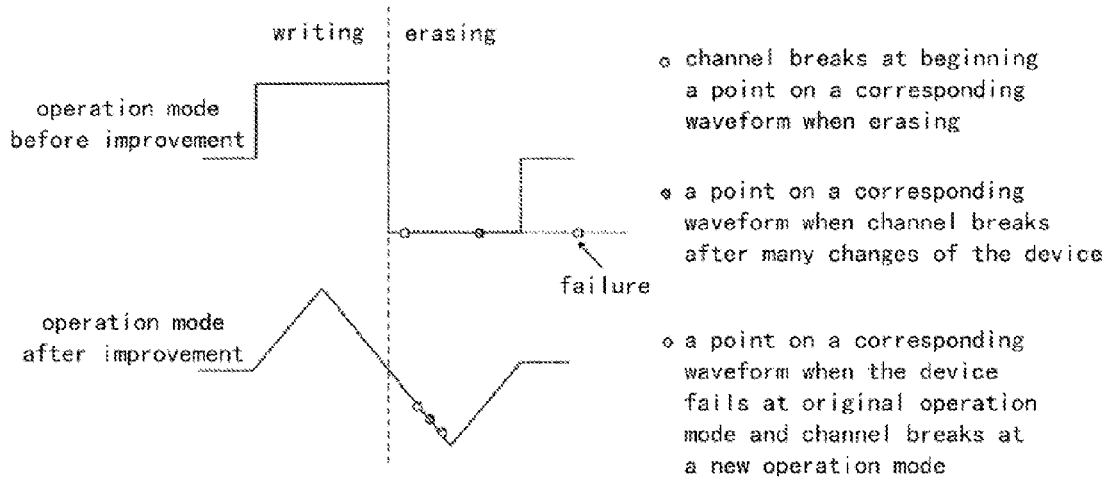
FIG. 6 shows a schematic diagram of the influence of a voltage pulse waveform on the durability characteristic of a resistive switching device.

FIG. 6 shows a schematic diagram of the influence of a voltage pulse waveform on the durability characteristic of a resistive switching device. Generally, the defects will be accumulated continuously and the voltage required by a RESET (erasing) will increase during the transition of the resistive switching device. This will result in the failure of the device. As shown in FIG. 6, when the square wave pulse of the prior art is employed, the current overshoot effect during a SET (programming) operation causes the number of defects generated at every transition to be increased. The RESET (erasing) voltage would be insufficient due to the defect accumulation. However, by using the scheme according to the present disclosure such as a triangular wave pulse (maximum voltage range being 0.1V-40V), due to a front edge which rises up slowly during a SET(programming) operation, suppression of the current overshoot effects causes the controllability of the defects rise up. Whereas, a RESET (erasing) voltage point can be adjusted automatically during using the RESET (erasing) of the triangular wave, which causes the electrical field inside the device more controllable.

Figure 7:
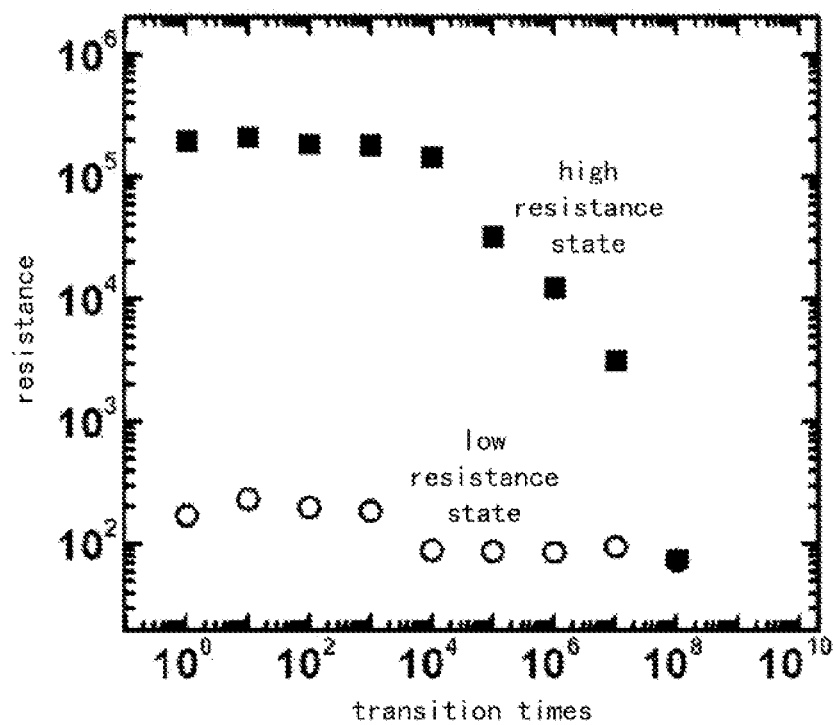
FIG. 7 shows a change in the resistive characteristic presented by a resistive switching memory device operated by a traditional method.
Figure 8:
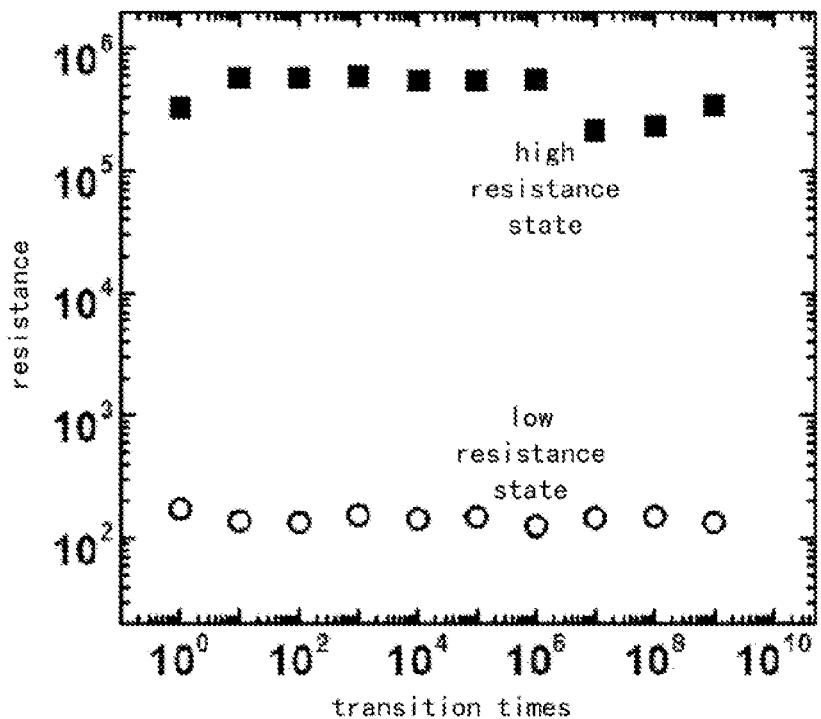
FIG. 8 shows a change in the resistive characteristic presented by a resistive switching memory device operated by a method according to an embodiment of the present disclosure.

FIG. 7 shows a change in the resistive characteristic presented by a resistive switching memory device operated using a traditional method. FIG. 8 shows a change in the resistive characteristic presented by a resistive switching memory device operated using a method according to an embodiment of the present disclosure. As can be seen from the comparison of the transition times of FIG. 7 and FIG. 8, by using the scheme of the present disclosure, the transition times are improved considerably, which is increased from original $10^7$ times to $10^9$ without an obvious degradation.

While the disclosure has been described with reference to several specific embodiments, it should be understood that the used terms is illustrative of the disclosure, and not to be considered as limiting the disclosure. Since the present disclosure can be implemented in a variety of forms and does not depart from the true spirit and scope of the disclosure, it should be understood that the above embodiments are not limited to any preceding details, but are explained in the spirit and scope as defined by the appended claims widely. Thus, all changes and modifications fallen in the claims and equivalents thereof should be covered by the appended claims.

We claim:

1. A resistive switching memory device, comprising:
   a plurality of resistive switching memory units arranged in a matrix, each of resistive switching memory units including a switching element and a resistive switching device, and the switching element being connected to a word line at its control terminal, to the resistive switching device at one terminal, and to a bit line at the other terminal;
   a word line decoder adapted to decode an input address signal to switch on the switching element in at least one of resistive switching memory units; and
   a driving circuit adapted to apply a voltage pulse whose front edge changes slowly across the resistive switching device by the bit line synchronously with the switching-on of the switching element.

2. The resistive switching memory device according to claim 1, wherein the voltage pulse is a positive pulse whose front edge rises up slowly.

3. The resistive switching memory device according to claim 1, wherein the voltage pulse is a negative pulse whose front edge falls down slowly.

4. The resistive switching memory device according to claim 1, wherein a period from a starting point to a pulse peak value or a pulse valley value of the voltage pulse is lager than 20% of duration of the voltage pulse.

5. The resistive switching memory device according to claim 4, wherein a wave form of the voltage pulse is a triangular wave, a sinusoidal wave, a cosine wave, a raised cosine wave, or a trapezoidal wave.

6. A method for operating a resistive switching memory device, the resistive switching memory device comprising a plurality of resistive switching memory units arranged in a matrix, each of resistive switching memory units including a switching element and a resistive switching device, and the switching element being connected to a word line at its control terminal, to the resistive switching device at one terminal, and to a bit line at the other terminal, the method comprising:
   decoding an input address signal to switch on the switching element in at least one of resistive switching memory units; and
   applying a voltage pulse whose front edge changes slowly across the resistive switching device by the bit line synchronously with the switching-on of the switching element.

7. The method according to claim 6, wherein the voltage pulse is a positive pulse whose front edge rises up slowly.

8. The method according to claim 6, wherein the voltage pulse is a negative pulse whose front edge falls down slowly.

9. The method according to claim 6, wherein a period from a starting point to a pulse peak value or a pulse valley value of the voltage pulse is lager than 20% of duration of the voltage pulse.

10. The method according to claim 6, wherein a wave form of the voltage pulse is a triangular wave, a sinusoidal wave, a cosine wave, a raised cosine wave, or a trapezoidal wave.

* * * * *